US006459039B1

(12) United States Patent
Bezama et al.

(10) Patent No.: US 6,459,039 B1
(45) Date of Patent: *Oct. 1, 2002

(54) METHOD AND APPARATUS TO MANUFACTURE AN ELECTRONIC PACKAGE WITH DIRECT WIRING PATTERN

(75) Inventors: Raschid J. Bezama, Mahopac, NY (US); Govindarajan Natarajan, Pleasant Valley, NY (US); Robert W. Pasco, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/597,906

(22) Filed: Jun. 19, 2000

(51) Int. Cl.[7] .................................. H05K 1/02
(52) U.S. Cl. ..................... 174/52.4; 439/91; 174/255; 174/260; 361/760
(58) Field of Search .................. 29/832, 833, 840, 29/843, 846; 174/52.1, 52.4, 255, 260, 261, 262; 361/748, 760, 761, 762, 763, 764; 439/66, 91

(56) References Cited

U.S. PATENT DOCUMENTS

| | | | |
|---|---|---|---|
| 4,202,007 A | * 5/1980 | Dougherty et al. | ............ 357/80 |
| 4,793,814 A | * 12/1988 | Zifcak et al. | ................. 439/66 |
| 4,998,885 A | 3/1991 | Beaman | |
| 5,123,852 A | 6/1992 | Gillett | |
| 5,531,022 A | 7/1996 | Beaman et al. | |
| 5,805,426 A | * 9/1998 | Merritt | ....................... 361/769 |
| 5,917,707 A | 6/1999 | Khandros et al. | |
| 5,926,951 A | 7/1999 | Khandros et al. | |
| 5,967,804 A | * 10/1999 | Yoshizawa et al. | ........... 439/91 |
| 6,078,500 A | * 6/2000 | Beaman et al. | ............. 361/704 |
| 6,271,478 B1 | * 8/2001 | Horiuchi et al. | ............ 174/255 |
| 6,332,782 B1 | * 12/2001 | Bezama et al. | ............... 439/66 |

OTHER PUBLICATIONS

Coaxial Connector, R. E. Heath and L. K. Schultz, IBM Technical Disclosure Bulletin, pp. 3987–3988, vol. 21, No. 10, Mar. 1979.

* cited by examiner

Primary Examiner—Dean A. Reichard
Assistant Examiner—Carmelo Oliva
(74) Attorney, Agent, or Firm—Margaret A. Pepper

(57) ABSTRACT

An electronic package assembly for electrical interconnection between two electronic modules having differing conductive array parameters is disclosed. The electronic package assembly includes two electronic modules, providing between the two electronic modules an interposer having a top surface and a bottom surface; a first set of conductive arrays having a first conductive array parameter on the top surface, and a second set of conductive arrays having a second conductive array parameter on the bottom surface, the second conductive array and the first conductive array having differing parameters. A plurality of conductors traverses a thickness of the interposer of the electronic package assembly, with the conductors including a conductive material optionally coated with a dielectric material, the conductors having a first end at the first conductive arrays and a second end at the second conductive arrays, whereby the conductors connecting the first and second conductive arrays therein are adapted to spatially transform the differing parameters to provide an electrical interconnection. A conductive matrix surrounds the conductors of the interposer of the electronic package assembly. The first set of conductive arrays includes the same conductive array parameters as a first electronic module and the second set of conductive arrays includes the same conductive array parameters as a second electronic module.

31 Claims, 5 Drawing Sheets

METHOD AND APPARATUS TO MANUFACTURE AN ELECTRONIC PACKAGE WITH DIRECT WIRING PATTERN

RELATED APPLICATION

Aspects of the present invention are related to subject matter disclosed in co-pending application Ser. No. 09/597,919 entitled "Spatial Transformation Interposer for Electronic Packaging" by the same inventors, filed on even date herewith and assigned to the assignee of the present invention.

BACKGROUND OF THE INVENTION

1. Field of the Invention

The present invention relates to electronic assembly packages, and in particular, to an apparatus and method of making an electronic assembly package wherein two electronic modules, having differing conductive array parameters, are electrically and mechanically interconnected by an interposer structure which spatially transforms such differing conductive array parameters thereby forming the electronic assembly package.

2. Description of Related Art

In surface mount technology, integrated circuits (ICs) have leads, or signal Input/Output (I/O) connections, and Power/ Ground (P/G) connections which are connected to ceramic or organic packages which in turn also have leads extending therefrom. Such IC assemblies include, for example, single chip modules (SCM), wherein one chip is connected to a single chip module, or multi-chip module (MCM), wherein more than one chip is connected to an organic or ceramic package containing multi-layers of thick-film or thin-film circuitry separated by dielectric layers and interconnected by vias. The electrical attachment of the IC to the package, resulting in an IC package, is often referred to as the first level of attachment. In this attachment level, P/G and I/O connections exist on surfaces of both IC dies and first level packages. Such connections terminate in conductive pads or fingers which are used to connect both components using Controlled Collapse Chip Connection (C4), or wirebonds. Controlled Collapse Chip Connection is an interconnect technology developed by IBM as an alternative to wire bonding. This technology is generally known as C4 technology or flip chip packaging. Broadly stated, one or more integrated circuit chips are mounted above a single or multi-layer ceramic substrate and pads on the chip are electrically and mechanically connected to corresponding pads on a substrate by a plurality of electrical connections such as solder bumps. The integrated circuit chips may be assembled in an array such as a 10×10 array on the multi-layer ceramic surface.

The electrical attachment of the IC package to the board is the second level of attachment. In second level attaching, I/O connections exist on surfaces of both IC packages and circuit boards. Such connections terminate in conductive leads, pins, wires, pads, balls, fingers, and any other mating system known in the art, thereby connecting the IC package to a circuit board for receiving, generating or continuing an electrical interconnection. Typically, the second level electrical attachment of two electronic modules using the above connection terminals is achieved by a variety of methods as disclosed in the prior art, such as wire bonding, Pin Grid Arrays (PGAs), Ball Grid Arrays (BGAs), Column Grid Arrays (CGAs), coaxial interconnect devices, elastomeric interconnect devices, and the like. Various such prior art discloses not only connecting the IC package to the board, but also assisting in the absorption of the difference in Coefficient of Thermal Expansion (CTE) between the package and the circuit board. However, even with such attachment means, a large CTE mismatch can still cause failure at various sites in the attachment when the first level packaging is made from a ceramic or metal composite.

Currently, the trend for IC chips is to increase the density and number of I/O connectors on a die, thereby increasing the number of I/O connections at both first and second level attachments. Such trends furthermore result in IC packages and boards with differing conductive connector array parameters such as differing size, shape, pitch, and connector type. Since the board fabrication technology can not easily increase the I/O array density, any increase in I/O count is accommodated by an increase in the dimensions of the I/O connector array required to interconnect to the first level package, whereby the first level package is then used to transform the high density I/O connection of the IC into the low density I/O connection of the board. In parallel, the first level package can accommodate an increase in I/O count by increasing the number of x-y redistribution layers in the package, and by increasing its size to match the increased dimensions of the I/O connection array on the board. When the first level package Coefficient of Thermal Expansion (CTE) is different than the CTE of the second level package, any increase in the size of the first level package size will result in an increased mechanical stress level of the assembly, consequently resulting in decreased product reliability. The above methods of attaching two electronic modules having differing array size, shape, pitch, and the like, with increased I/O count, leads to increased production costs, increased size of the resulting second level attachment, and decreased reliability.

As the trends continue for IC packages having increased density, number of ICs on a package, increased number of I/O connections at the first and second level of attachment, and differing I/O conductive connection array size, shape, pitch, connector type, and the like, the demand continues for improvements in connecting electronic modules in surface mount technology. An ideal first or second level connection scheme is an electronic assembly package that would provide the ability to directly connect two electronic modules having differing I/O conductive connector array parameters such as size, shape, pitch, and connector type, be compatible with the fabrication for a variety of conductive arrays, have a simple mechanical structure such that it can be easily and inexpensively manufactured, have a high processing yield, produce a decrease in the size of the resultant surface mount package, and be consistently reliable. Furthermore, such an electronic assembly package would allow for high density I/O connections, controlled impedance, high signal isolation, and high reliability.

Bearing in mind the problems and deficiencies of the prior art, it is therefore an object of the present invention to provide an apparatus and method of fabricating the apparatus for attaching two electronic modules having differing array parameters at a first and/or second level attachment, thereby creating an electronic package.

A further object of the invention is to provide an improved electronic assembly package for first level attachments.

It is yet another object of the present invention to provide an improved electronic assembly package for second level attachments.

Another object of the invention is to provide an improved electronic assembly package having decreased size.

It is yet another object of the present invention to provide an improved electronic assembly package which decreases production costs at the first and/or second level attachment.

Another object of the invention is to provide an improved electronic assembly package without x-y redistribution layers.

Still another object of the invention is to provide a method of making and assembling an improved electronic assembly package having enhanced yield and reliability.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, an electronic package assembly for electrically connecting two electronic modules and method of making the same comprising a first substrate having a first conductive array grid with a first conductive array parameter; a second substrate having a second conductive array grid, said second conductive array grid having differing parameters than said first conductive arrays; an interposer which spatially transforms said differing parameters having a plurality of conductors traversing a thickness of said interposer, said conductors comprising at least a conductive material; and a conductive matrix surrounding said plurality of conductors; and an electronic package assembly having the interposer aligned between two electronic modules, thereby forming an electronic package assembly having an interposer which spatially transforms said differing parameters for electrical interconnection. The interconnect substrate also includes a plurality of conductors comprising a conductive material, with the conductors traversing a thickness of the interposer thereby spatially transforming the differing parameters by connecting the first conductive array grid to the opposing, differing second conductive array grid and providing an electrical interconnection; and a conductive matrix surrounding the plurality of conductors. The differing parameters may comprise differing array pitch measurements, differing array shape, or differing array size.

The conductors may comprise a metal selected from the group consisting of copper, tungsten, molybdenum, aluminum and gold. The interposer of the electronic package assembly may include a non-conductive material coating the conductors of the conductive matrix. The first and second conductive array grids may have an equal number of arrays. Preferably, the plurality of conductors traverse a thickness of the interposer, with the conductors forming a plurality of angles with a top portion and a bottom portion of the interposer. The plurality of conductors may comprise a plurality of conductive wires, preferably having the same impedance, or a plurality of conductive coaxial wires. The interposer of the electronic package assembly may be a conductive interposer made from conductive material such as conductive polymer, inorganic composite or metal, or may be a non-conductive interposer made from a non-conductive material. Preferably, the interposer of the electronic package assembly comprises a material having a coefficient of thermal expansion corresponding to the coefficient of thermal expansions of an IC package and a board when the interconnect substrate is used to connect an IC package to a board. In use, the interposer of the electronic package assembly is positioned between two electronic modules, with the two electronic modules having receiving conductive array connections corresponding to the first and second conductive array grids on opposing sides of the interposer of the electronic package assembly.

In a related aspect, the present invention provides an electronic package assembly for electrical interconnection between two electronic modules having differing conductive array parameters. The interposer of the electronic package assembly comprises an interposer having a top surface and a bottom surface; a first set of conductive arrays having a first conductive array parameter on the top surface, and a second set of conductive arrays having a second conductive array parameter on the bottom surface, the second conductive array and the first conductive array having differing parameters. A plurality of conductors traverse a thickness of the interposer of the electronic package assembly, with the conductors comprising a conductive material and optionally coated with a dielectric material, the conductors having a first end at the first conductive arrays and a second end at the second conductive arrays, whereby the conductors connecting the first and second conductive arrays therein are adapted to spatially transform the differing parameters to provide an electrical interconnection. A conductive matrix surrounds the conductors.

Preferably, the first conductive array parameter corresponds to the same conductive array parameter on a first electronic module and the second conductive array parameter corresponds to the same conductive array parameter on a second electronic module.

Said conductive material may comprise a conductive wire, a coaxial wire or a via filled with conductive material. The coating of dielectric material may be an organic polymer, polyimide, polyester, alumina, glass or inorganic powder filled polymer. The plurality of conductors preferably form angles with top and bottom surface of the interposer.

In another aspect, the present invention provides a method of fabricating an electronic package assembly for electrically connecting two electronic modules comprising providing a first substrate having a first conductive array grid with a first conductive array parameter; providing a second substrate having a second conductive array grid, said second conductive array grid having differing parameters than said first conductive arrays; providing an interposer which spatially transforms said differing parameters having a plurality of conductors traversing a thickness of said interposer, said conductors comprising at least a conductive material, and a conductive matrix surrounding said plurality of conductors; and providing an electronic package assembly having the interposer aligned between two electronic modules, thereby forming an electronic package assembly having an interposer which spatially transforms said differing parameters for electrical interconnection.

In yet another, related aspect, the present invention provides a method of fabricating an electronic package assembly comprising providing an interposer of the electronic package assembly having a top surface and a bottom surface, providing a first set of conductive arrays having a first conductive array parameter on the top surface, and providing a second set of conductive arrays having a second conductive array parameter on the bottom surface, the second conductive array and the first conductive array having differing parameters. The method then includes determining a spatial transformation between the differing parameters of the first and second conductive arrays, and forming a plurality of conductors traversing a thickness of the interposer, the conductors having a first end at first conductive arrays and a second end at the second conductive arrays, the conductors connecting the first and second conductive arrays therein, spatially transforming the differing parameters to provide an electrical interconnect structure. The method then includes connecting the first and second substrates by providing between the first and second substrates the interconnect structure, the interposer of the electronic package assembly spatially transforming and connecting the first and second sets of contact pads thereby providing an electrical interconnection between the first and second substrates having differing conductive array grids.

The electronic module assembly may be formed having top and bottom portions thereon, with the top portion having the first conductive array grid and the bottom portion having the second conductive array grid. Forming of the interposer of the electronic package assembly may be by injection molding. Forming the conductors may be with a removable material, wherein subsequent to removal the conductor is at least filled with a conductive material. The conductors may be formed with a plurality of vias, a plurality of conductive wires or a plurality of conductive coaxial wires traversing through the interposer. Said plurality of conductors preferably form a plurality of angles with the top and bottom surfaces of the interposer. Said interposer of the electronic package assembly may be formed prior or subsequent to formation of the conductors.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
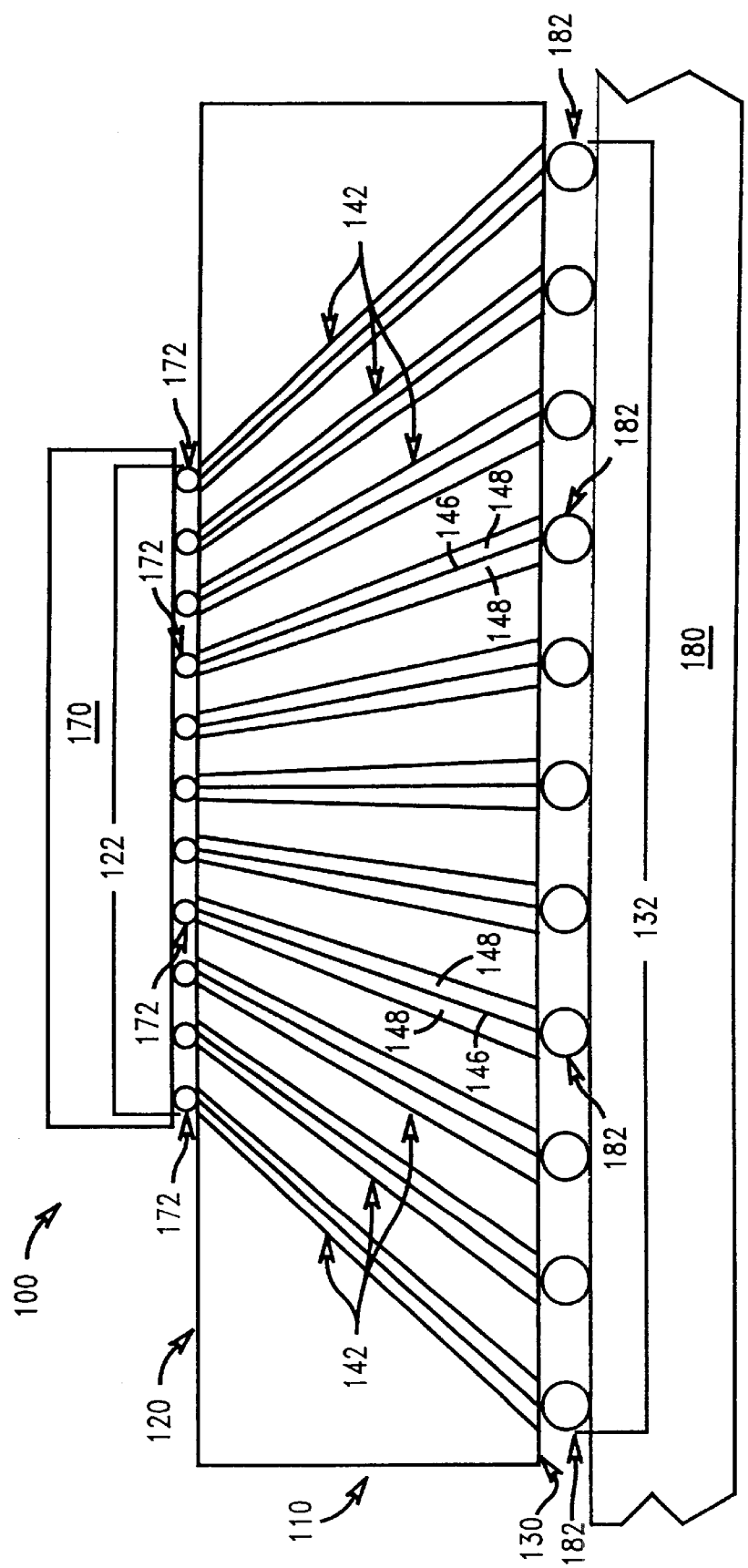
FIG. 1 shows an elevational cross-sectional view of the electronic package assembly of the present invention demonstrating the spatial transformation of providing an electrical connection from the first conductive array grid to the second conductive array grid using an interposer.

In describing the preferred embodiment of the present invention, reference will be made herein to FIGS. 1–5D of the drawings in which like numerals refer to like features of the invention. Features of the invention are not necessarily shown to scale in the drawings. Numerous embodiments of the present invention are possible, including the embodiments described below.

The present invention comprises an electronic package assembly and a method of making the same which provides an electrical interconnection between two electronic modules having the same number of I/O arrays but differing conductive array parameters. Such conductive array parameters are defined as I/O array pitch, size, shape, type of array, such as conductive leads, pins, wires, pads, balls, fingers, and any other mating system known in the art, and combinations thereof. Such electronic module interconnections include, for example, an IC package to a circuit board, wherein the IC package may comprise a SCM, MCM, or an IC die to a first or second level package. The electrical attachments may be achieved by a variety of methods as known and used in the art, including wire bonding, Pin Grid Arrays (PGAs), Ball Grid Arrays (BGAs), Column Grid Arrays (CGAs), coaxial interconnect devices, elastomeric interconnect devices, wire-column, and the like, for example.

In a preferred embodiment of the inventive electronic package assembly, two electronic modules are connected by an interposer, which has a plurality of conductors traversing through the body of such interposer. In the electronic package assembly of the present invention, a plurality of conductors traverse through the body of the interposer to provide an interconnection between two electronic modules having the same number of I/O conductive connector arrays on corresponding conductive array grids but differing array parameters, thereby providing electrical and mechanical connection thereto to form the electronic package assembly of the present invention. Such conductive arrays further comprise a conductive wire, which is optionally surrounded by a dielectric coating, wherein the plurality of conductors are at least surrounded by a conductive matrix.

The plurality of conductors have a first end which correlates with a first conductive array grid and a second end which correlates with a second conductive array grid. Preferably, the first conductive array grid is on a top surface of the interposer and the second conductive array grid is on a bottom surface of such interposer. In a preferred embodiment of the electronic package assembly, the number of arrays on the first and second conductive array grids of the interposer of the electronic package assembly are equal but the conductive array parameters of such first and second array grids differ. Typically, the prior art discloses solving such interconnecting problems by adding x-y redistribution layers to the first level package which provide the needed x-y translation, thereby matching the IC array pitch to the board array pitch. Alternatively, the prior art discloses decreasing the size of the board connecting array pitch, when the existing board fabrication allows the same, thereby matching the array pitch of the board to that of the IC. Such prior art methods lead to increased production costs.

The present invention avoids the use x-y redistribution layers, as well as avoids decreasing the size of the board connecting array pitch. The electronic package assembly of the present invention uses an interposer to spatially transform the differing conductive array parameters of two electronic modules. The interposer of the inventive electronic package assembly provides a plurality of substantially straight column-like conductors connected to a first conductive grid array, which are then attenuated, in substantially the shortest distance possible, to form a substantially straight conductor connection to a corresponding number of arrays in a second conductive array grid. During the formation of the straight conductor interconnections, such conductors are extrapolated through the body of the interposer thereby forming angles with the top and bottom surfaces of the interposer. As the difference of conductive array parameters of corresponding arrays on the first and second conductive array grids increase, the angle of the conductor with the top and bottom surface of the interposer structure becomes more defined, therein creating a smaller angle and ultimately limiting the maximum difference between both conductive array grids. A practical maximum difference, determined by geometric evaluation, may be, for example, 100%, i.e. the layer array grid has twice the pitch of the smaller array grid.

The interposer of the electronic package assembly of the present invention is provided between two electronic modules, wherein one electronic module has substantially the same conductive array grid and parameters for receiving, generating or continuing an electrical interconnection with the first conductive array grid on the interposer, and the other electronic module has substantially the same conductive array grid and parameters for receiving, generating or continuing an electrical interconnection with the second conductive array grid on the interposer. As disclosed above, such electrical attachment may be achieved by a variety of methods as known and used in the art, including wire bonding, Pin Grid Arrays (PGAs), Ball Grid Arrays (BGAs), Column Grid Arrays (CGAs), solder balls, coaxial interconnect devices, elastomeric interconnect devices, and the like, for example.

FIG. 1 illustrates the inventive electronic package assembly 100 having a first electronic module, such as an IC package 170, electrically and mechanically connected to second electronic module, such as a board 180, by interposer 110 of the electronic package assembly 100. Traversing through the body of the interposer 110 of the electronic package assembly 100 is a plurality of conductors 142, wherein such plurality of conductors 142 consist of an electrical wire 146, electrically isolated from the interposer matrix 140 by a dielectric coating 148. Wherein the potential of the connectors equals the potential of the conductive matrix 140, such connectors do not require the dielectric coating 148. As will be known to one skilled in the art, the conductive arrays 142 may comprise various shapes, sizes, and varieties, such as leads, conductive leads, pins, pads, balls, fingers, array types, and the like, or combinations thereof, for example. See FIGS. 1, and 2A–B. The interposer 110 of the electronic package assembly 100 of the present invention may comprise a conductive or non-conductive matrix material forming matrix 140 including, for example, a conductive or non-conductive plastic, a ceramic, a metal, or a composite. Preferably, interposer 110 of the electronic package assembly 100 is made from a conductive material, such as, conductive polymer, conductive inorganic composite or metal.

Interposer 110 of the electronic package assembly 100 may comprise a plurality of shapes, such as, a cube, a sheet, and a disk, for example. Interposers typically comprise a matrix material whose structure and thickness render it stiff enough to be processed using conventional semiconductor fabrication techniques and to permit registration to previously patterned features. The interposer 110 of the electronic package assembly 100 of the present electronic package assembly may comprise a conductive or non-conductive matrix material including, for example, a conductive or non-conductive plastic, a ceramic, a metal, or a composite. Preferably, interposer 110 of the electronic package assembly 100 is made from a conductive material, such as, conductive polymer, conductive inorganic composite or metal. Traversing through the body of the interposer 110 of the electronic package assembly 100 is a plurality of conductors 142, wherein such plurality of conductors 142 consist of a conductive material, such as an electrical wire 146, which optionally may be electrically isolated from the interposer matrix 140 by a non-conductive material coating, such as a dielectric coating 148. The dielectric material may be an organic polymer, polyimide, polyester, alumina, glass, or an inorganic powder filled polymer. Where the potential of the connectors equals the potential of the conductive matrix 140, such connectors do not require the dielectric coating 148.

Figure 2A:
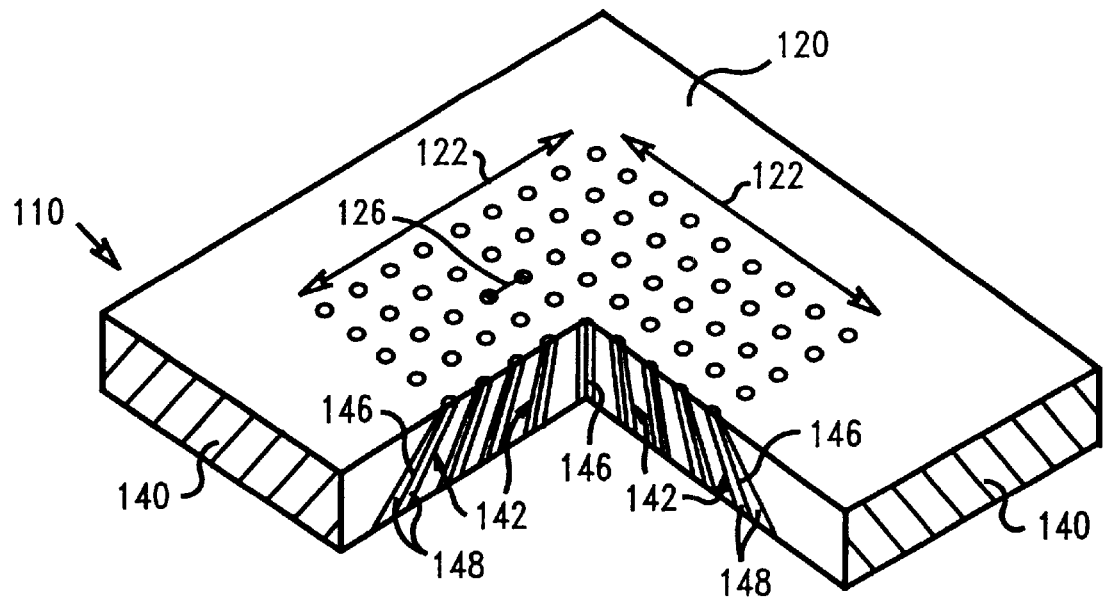
FIG. 2A shows a top plan view of an interposer used in the electronic package assembly of FIG. 1 illustrating the first conductive array grid having a first conductive array parameter, more specifically, a first pitch.
Figure 2B:
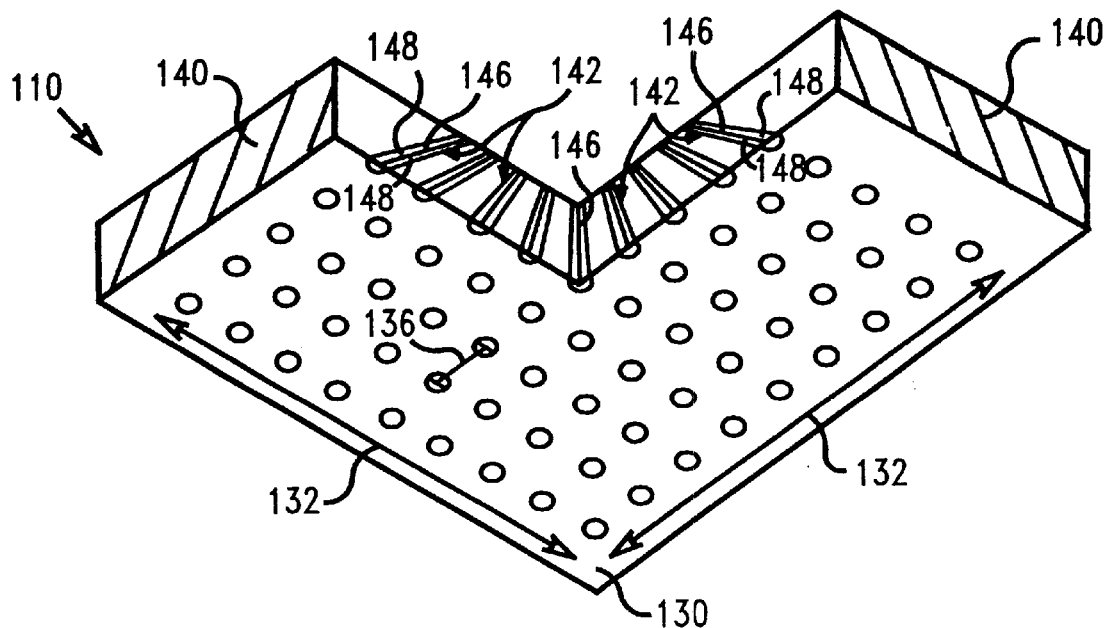
FIG. 2B shows a bottom plan view of an interposer used in the electronic package assembly of FIG. 1 illustrating the second conductive array grid having a second conductive array parameter, more specifically, a second pitch.
Figure 3A:
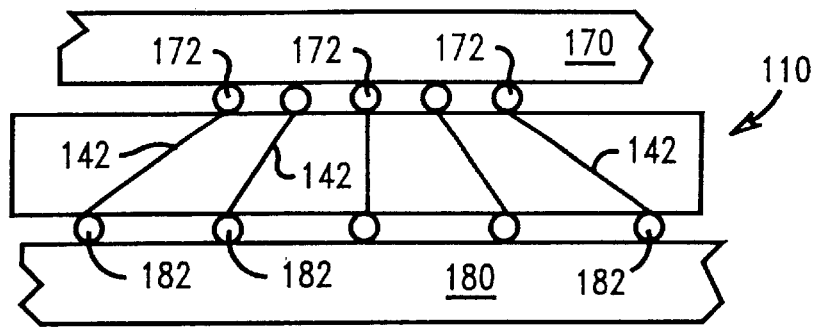
FIGS. 3A–D illustrates a variety of interconnection means which can be used to assemble the electronic package assembly of the present invention.
Figure 3B:
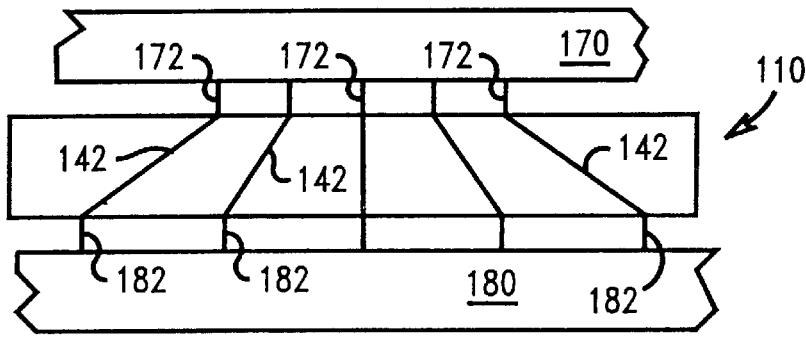
Figure 3C:
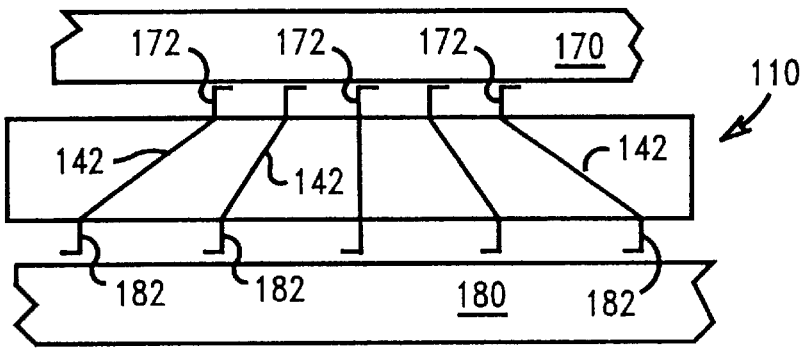
Figure 3D:
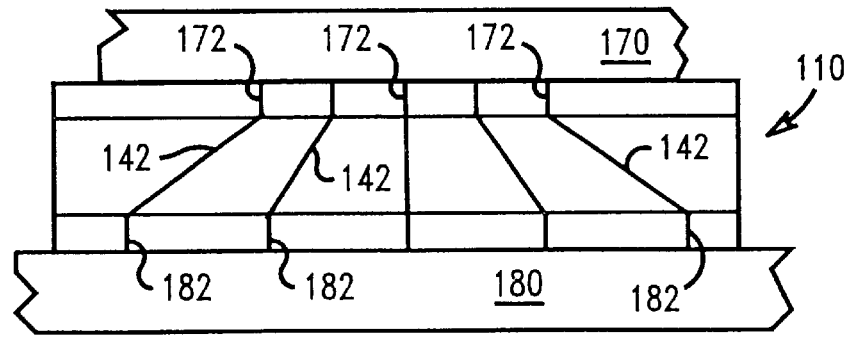

In FIG. 2A there is shown a top partial perspective view of the interposer 110 of the electronic package assembly 100 used in the electronic package assembly showing a first conductive array grid. On a top surface 120 of the interposer 110 of the electronic package assembly 100 is a first set of a plurality of I/O conductive arrays which forms a first conductive array grid 122. Such first conductive array grid 122 comprises a determinable number of conductive arrays, each spatially located on the top surface 120. FIG. 2B illustrates a bottom partial perspective view of interposer 110 of the electronic package assembly 100 showing a second conductive array grid 132 on a bottom surface 130 of interposer 110 of the electronic package assembly 100. Such second I/O conductive array grid 32 also comprises a determinable number of conductive arrays, each spatially located on the bottom surface 130 of the interposer 110 of the electronic package assembly 100. Preferably, the number of conductive arrays of the first conductive array grid 122 and the second conductive array grid 132 are equal, for example, both grids may comprise 10×10 arrays; however, the parameters of the arrays may differ, such as differing pitch, for example. For ease of viewing and understanding a preferred embodiment of the present invention, circles illustrate the conductive arrays which form first and second conductive array grids 122 and 132. Furthermore, such arrays may comprise various shapes, sizes, and varieties or types, such as leads, conductive leads, pins, pads, balls, fingers, and the like, or combinations thereof.

As illustrated in FIGS. 2A and 2B, first and second conductive array grids, 122 and 132, have the same number of conductors with differing parameters. Illustrated as an example of differing parameters, a pitch measurement 126 comprises a nominal distance from the center of one array to the center of an adjacent array in the first array grid 122. On the opposite, parallel side of the interposer 110 of the electronic package assembly 100, a second pitch measurement 136 is illustrated in FIG. 2B. Pitch measurement 136 comprises a second nominal distance from the center of one array to the center of an adjacent array in the second array grid 132. In one embodiment of the present invention, the two pitch measurements are not equal; however, such is not a requirement. Pitch measurement 126 of the distance between array to array on the top surface 120 of interposer 110 of the electronic package assembly 100 may be, for example, smaller than the pitch measurement 136 of the distance between array to array on the bottom surface 130 of interposer 110 of the electronic package assembly 100. In such an embodiment of the present invention, conductive array grid 132 are distributed more broadly over the bottom surface 130 in comparison to the distribution of arrays of conductive array grid 122 on the top surface 120.

In accordance with the present invention, the protective, non-conductive dielectric layer 148 of each of the conductors 142 has a radial thickness which changes as the non-conductive dielectric layer 148 traverses through the interposer 110. In particular, the partial perspective views of the first and second conductive array grids in FIGS. 2A and 2B, respectively, show the coaxial conductors 142 having a first radial thickness or diameter at the first conductive array grid 122 on the top surface 120 and a differing, second radial thickness or diameter at the second conductive array grid 132 on the bottom surface 130. As the coaxial conductors 142 traverse through the body of the interposer from the top surface 120 to the opposing, second surface 130 of the interposer, the radial thickness or diameter of the non-conductive dielectric layer 148 of the coaxial conductors 142 gradually changes in dimension, thereby gradually changing the overall radial thickness or diameter of the coaxial conductors 142. For example, as shown in FIGS. 2A and 2B, the non-conductive dielectric layer 148 of the coaxial conductors 142 may have a small radial thickness or diameter at the top surface 120 of the interposer whereby the radial thickness of the non-conductive dielectric layer 148 gradually increases to a larger radial thickness at the bottom surface of the interposer as the coaxial conductors 142 traverse the interposer 110.

Furthermore FIGS. 1, 2A and 2B, illustrate the plurality of conductors 142 forming a spatial transformation of a conductive array parameter, such as pitch, from the first conductive array grid 122 to the second conductive array grid 132. As illustrated the plurality of conductors 142 traverse a thickness of the interposer 110 of the electronic package assembly 100. Conductors 142 comprise a conductive material, such as, copper, tungsten, molybdenum, aluminum, gold, or any other metal with high conductivity. Conductors 142 may include, for example, a conductive wire, a via filled with conductive material, a coaxial connector, and the like. In a preferred embodiment, the plurality of conductors 142 comprise a coaxial connector consisting of a center electrical wire 146, comprising a conductive material, surrounded by a protective, non-conductive dielectric layer 148 which prevents external electricity from affecting the current flowing in the center conductor. Further illustrated, the conductors 142 of the conductive matrix 140 traverse through the interposer 110 of the electronic package assembly 100. The conductors may be protected by forming a defined, solid conductive matrix 140 around and encasing the conductors, thereby the resultant matrix 140, with the encased conductors 142, forming the interposer 110 of the electronic package assembly 100 of the electronic package assembly 100. Matrix 140 may be formed by a variety of common fabrication techniques known and used in the art, including injection molding, and multi-layer ceramic processing techniques, for example.

As further illustrated in FIGS. 1, 2A–B, and 3A–D, the IC package 170 comprises a number of conductive arrays corresponding to the number and parameters of conductive arrays in a first conductive array grid 122 on the top surface 120 of interposer 110 of the electronic package assembly 100. The IC package 170 is connected to the first conductive array grid 122 by interconnection means 172 using techniques known in the art, including, wire bonding, Pin Grid Arrays (PGAs), Ball Grid Arrays (BGAs), Column Grid Arrays (CGAs), coaxial interconnect devices, elastomeric interconnect devices, and the like. The board 180, comprising a number of conductive arrays corresponding to the number and parameters of conductive arrays in a second conductive array grid 132 on the bottom surface 130 of interposer 110 of the electronic package assembly 100 is connected to the second conductive array grid 132 by interconnection means 182 using the above techniques. As illustrated in FIGS. 3A–3D, interconnection means 172 and 182 may also may comprise various shapes, sizes, and varieties, such as leads, conductive leads, pins, pads, balls, fingers, array types, and the like, or combinations thereof. See FIGS. 3A–D. However, it will be apparent to one skilled in the art that the connection of the first and second electronic modules may be a first level attachment and/or a second level attachment, as described above and illustrated in FIGS. 3A–3D.

Figure 4:
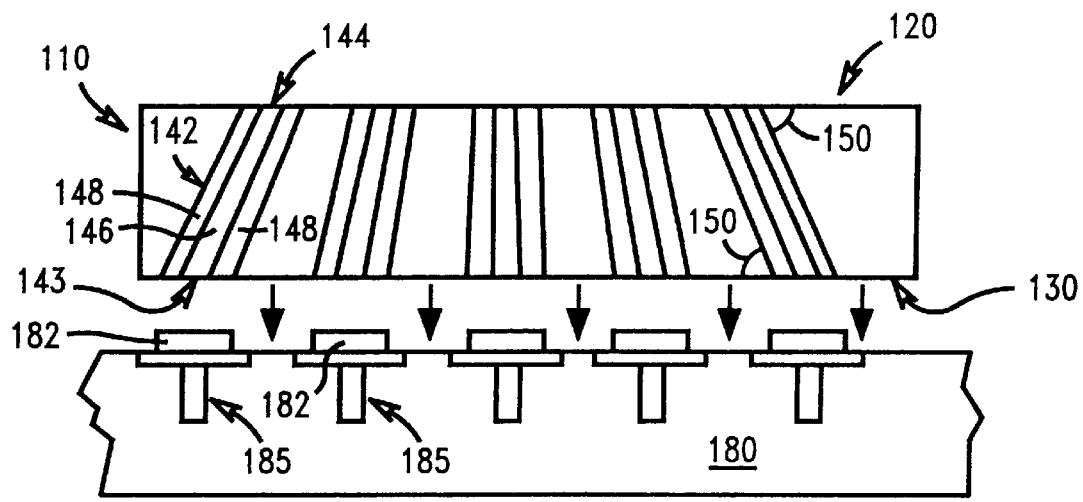
FIG. 4A shows an elevational cross-sectional view of the step of attaching an interposer of the electronic package assembly to a first electronic module.
FIG. 4B shows an elevational cross-sectional view of the interposer attached to a first electronic module in the electronic package assembly of FIG. 4A.
Figure 4:
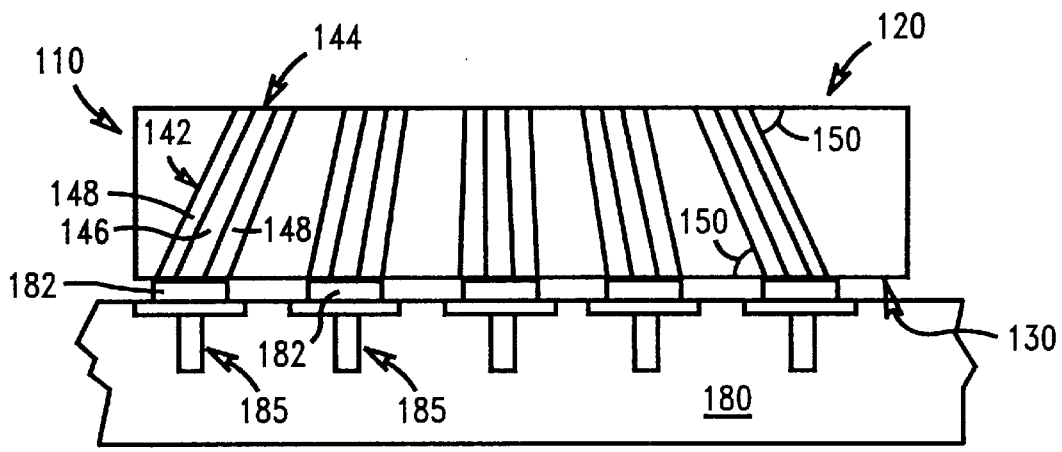
Figure 5A:
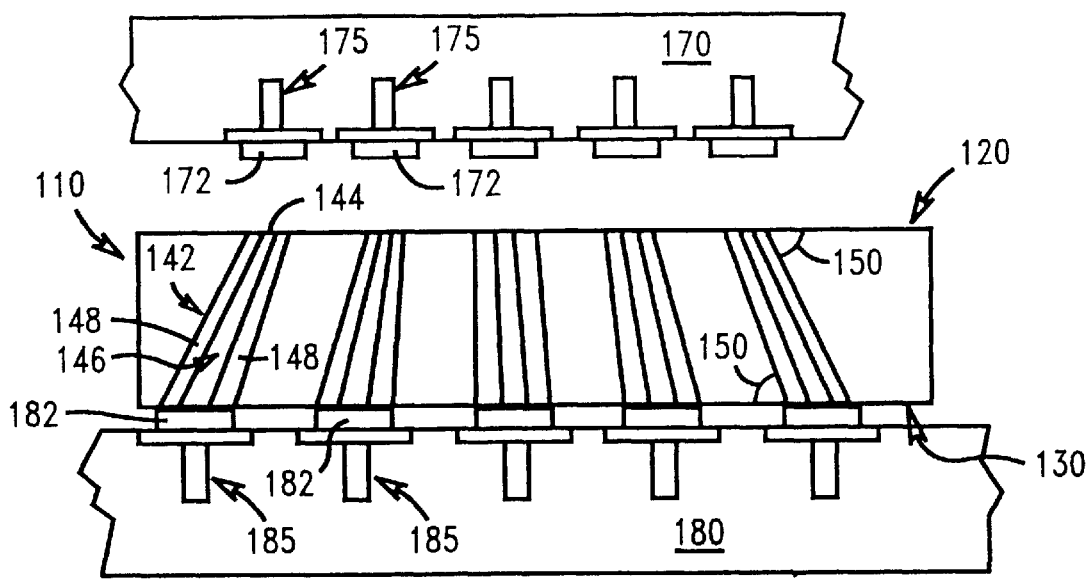
FIG. 5A shows an elevational cross-sectional view of the step of attaching the interposer with the first electronic module of FIG. 4B to a second electronic module.
Figure 5B:
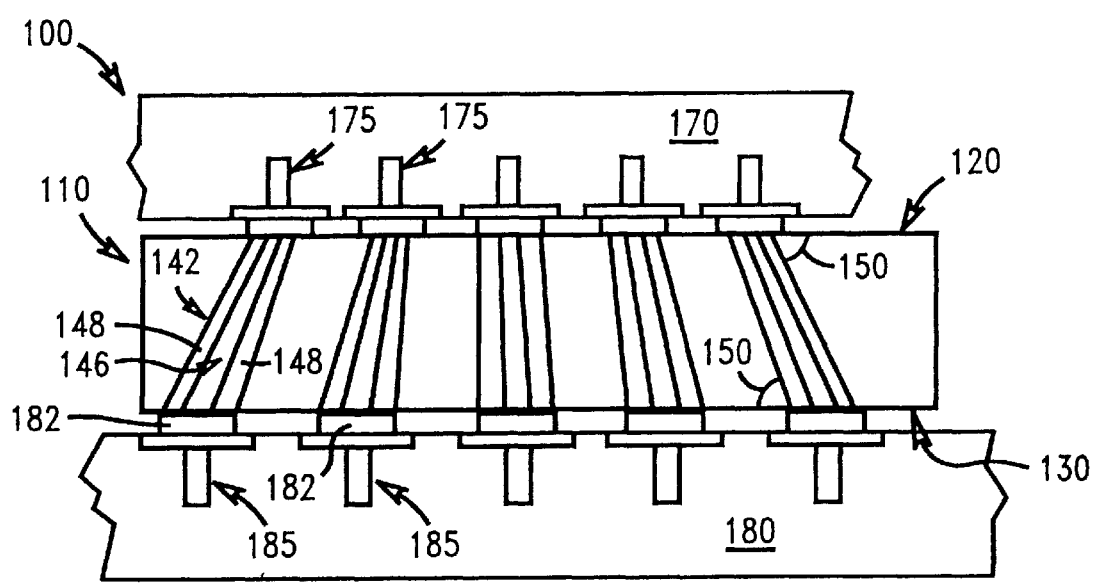
FIG. 5B shows an elevational cross-sectional view of the electronic package assembly of FIG. 5A with the interposer attached to two electronic modules.

In a preferred embodiment, as illustrated in FIGS. 4A, 4B, 5A, and 5B, the interconnection between the first and second electronic modules is formed by connecting a first end 143 of the coaxial conductors 142 to the first electronic module 180, or alternatively 170, wherein electrical wire 146 of the coaxial conductor has been surrounded by the protective, non-conductive dielectric layer 148 by techniques known in the art of wire fabrication. FIGS. 4A and 4B illustrate interposer 110 of the electronic package assembly 100 connecting to board 180 by interconnection means 182, wherein board 180 has corresponding receiving means 185 for receiving the first conductive grid array. The coaxial conductors 142 are then attenuated to connect to a second end 144 which correlates with the second electronic module, such as IC package 170, having differing conductive array parameters. FIGS. 5A and 45B illustrate interposer 110 attached to the first electronic module of the electronic package assembly 100 connecting to IC package 170 by interconnection means 172, wherein board 170 has corresponding receiving means 175 for receiving the second conductive grid array, thereby resulting in the inventive electronic package assembly 100. As a result of such connections, some conductive wiring may form a plurality of angles 150 with the top and bottom surfaces. See FIGS. 1–5D. Optionally, an adhesive layer may be applied to the surface of the interposer to assist in adhesion to the two electronic modules. The shortest set of conductors 142 will result when the larger grid array 132 can be generated by expanding the same uniformly to the smaller grid array 122, wherein the connector assignment at the top surface matches the identical location at the bottom surface. This type of pattern expansion is desirable because it facilitates interposer manufacturing processes, hence lowering production costs. The change in angle between a conductor 142 and interposer surface, and from the center of the interposer to the edge of the interposer is a consequence of the expansion process described above, wherein the magnitude of the smallest angle will be depend on the amount of expansion between both top and bottom grid arrays and the interposer thickness.

To assemble the set of coaxial wires into the location required to make an interposer, it is necessary first to assemble all wires at the required locations given by the smaller grid array, which are held in place by mechanical means known and used in the art. The set of connectors then may be expanded to the second grid array by using mechanical means, such as those used in the industry, or by chemical means with the use of thermo-sensitive material which can expand significantly with the application of heat. The reverse process is also possible wherein the wires are assembled to match the larger connector array grid, and the smaller gird array is made either mechanically, or with the help of a shrinkable material, such as those known and used in the art. Once the wires are placed into the desired location, the conductive polymer matrix is infiltrated in the spaces between wires using conventional filling techniques. The polymer can then be cured if required.

Alternatively, and dependent upon the selected manufacturing process, conductors 142 may further comprise at the first end 143 and the second end 144, a conductive connector array 160 for receiving an electronic module having a corresponding array. Connector array 160 connects perpendicularly with the top and bottom surfaces of the interposer, thereby forming a plurality of angles 154 with the conductors 142. Thereafter, the interconnect structure is formed encasing the conductive matrix, thereby resulting in the interposer of the electronic package assembly.

In another embodiment, conductors 142 may be formed after formation of the interconnect structure. A plurality of vias may be formed in the interconnect structure, wherein the vias directly connect the top surface conductive array grid to the bottom surface conductive array grid. The vias comprise first and second ends which correspond to the conductive arrays respectively on first and second electronic modules, such as a first IC package 170 and a second board 180, thereby allowing for an electrical interconnection between such first and second electronic modules. The vias may be formed by techniques known and used in the art, such as, photolithography, mechanical punching, precision drilling, laser ablation, or any other means which allow apertures of very small dimensions to be formed. The vias are subsequently at least filled with a conductive material such as an organic or a metal powder slurry, by techniques used in the art, including silk screening or extension.

Alternatively, a removable material may be used to connect the first and second conductive array girds. Such removable material may be removed subsequent to formation of the interconnect structure to produce interposer 110 of the electronic package assembly 100 having vias traversing therethrough. The empty vias are then at least filled with a conductive material by techniques described above.

Once the interposer has been fabricated, finishing of such interposer is performed by conventional means known and used in the art, such as by forming connection joints, capping, and the like. The interposer of the present inventive electronic package assembly may then be placed between and mechanically attach two electronic modules in a first and/or second level attachment. For example, the interposer may be placed between a board 180 and an IC package 170, having a chip(s) attached to either an MCM or SCM, for a second level attachment by methods used in the art. Thereby the interposer electrically interconnects the conductive arrays of the IC package 170 connected to the top surface of the interposer 110 of the electronic package assembly 100 to the conductive arrays of the board 180 connected to the bottom surface of the interposer 110 of the electronic package assembly 100. See FIGS. 3A–3D. In the above attachment, the IC package 170 is connected to the first conductive array grid by interconnection means 172 using techniques known in the art. Board 180 is connected to the second conductive array grid by interconnection means 182 using the above techniques. The assembly can be then be thermally reflowed to allow for the interposer 110 of the electronic package assembly 100 to provide an electrical interconnection between the IC package 170 and the board 180 having the same number of arrays but differing pitch of such array.

For example, a 33 mm ceramic SCM package, having a 1532 I/O pin array with an 0.80 mm pitch, may be connected to a conventional 50 mm plastic board having a 1532 I/O pin array with an 1.27 mm pitch. Thus, the SCM package and the circuit board have the same I/O pin array but differing pitch. The interposer of the present invention spatially transforms the 0.80 mm pitch of the package to connect with the 1.27 mm pitch of the board, thereby providing an electrical interconnection between the two electronic modules. Without the use of the interposer of the present invention, the size of the 33 mm ceramic package would have to be increased to the size of the circuit board, 50 mm, or alternatively, the pitch size of the board would have to be decreased, to allow for electrical connectivity of the package with the board. Typically, the resultant electronic package may short out if interconnection terminals 172 and 182 contact each other. Interposer 110 of the electronic package assembly 100 of the electronic package assembly prevents such shorting out by prohibiting contact between interconnection terminals 172 and 182. Furthermore, interposer 110 of the electronic package assembly 100 of the electronic package assembly prevents over compression of the interconnection terminals by acting as a stand off between the IC package 170 and the board 180.

The methods described here to produce the required shape transformation are all based on the use of vertically distributed x-y shrinkage/expansion variation in the initial product dielectric matrix. Here the dielectric matrix refers to the phase which surrounds the initial wiring phase. The present invention may be used to reduce and/or expand the conductive array parameter on one of the electronic modules relative to the other electronic module. For ease of understanding the present invention, various embodiments of the shrinkage-like transformation method are described below.

In one embodiment of the present invention, the conductors 142, comprising the electric wires 146 and optionally surrounding by the dielectric coating 148, are held on one of the electronic modules using a non-shrinking fixture, by means known and used in the art, to form a conductive wire matrix. A compressible, dielectric material fills a volume around the conductive wire matrix, by means used in the art, to form the interposer matrix 140 . The assembly is then subject to pressure and/or temperature treatment to shrink the dielectric material. After shrinking, the interposer 110 of the electronic package assembly 100 surfaces may be finished by methods known and used in the art, such as planarization, polishing, mechanical machining, or chemical treatment, thereby producing the final form.

In another embodiment, a set of ceramic layers having differing x-y shrinkage but the same via-pattern metallurgy are stacked and laminated using MCM processing methods as known and used in the art. The stack of layers preferably has a monotonically decreasing x-y shrinkage from the first layer to the last layer in the stack. For example, the bottom most layer in may be shrunk near zero in the x-y shrinkage and the top most layer the most. After sintering, by methods used and known in the art, to produce the final interposer 110 of the electronic package assembly 100 of the electronic package 100, the same may be finished by the methods above.

Alternatively, the ceramic layers may be cast having differing levels of porosity, wherein the ceramics are provided with the same via pattern by methods used in the art, such as, punching, screening, and the like. The same is sintered, by methods used in the art, to produce the final interposer 110 of the electronic package assembly 100 of the electronic package 100 and then finished by the methods above. Additionally, the set of ceramics may comprise, for example, a single layer, or one or more layers in the form of a sublam, which are pre-pressed or compressed at different pressures the same are stacked. For example, the bottom most layer is pre-pressed or compressed at the highest pressure, wherein the value of such highest pressure is needed to achieve a given x-y shrinkage which is near zero in this case, and the top most layer is pre-pressed at the least, wherein, the value of such the least pressure is needed to achieve a given x-y shrinkage which is the most for a given design foot-print in this case. After stacking the such pre-pressed or compressed layers, the same are bonded chemically or mechanically and subsequently sintered to achieve the interposer 110 of the electronic package assembly 100 of the electronic package 100.

In yet another embodiment, combinations of the above embodiments may be used to achieve the desired interposer 110 of the electronic package assembly 100 of the electronic package 100.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A surface mount assembly comprising:
    a first substrate having a first conductive array grid with a first conductive array parameter;
    a second substrate having a second conductive array grid with a second conductive array parameter, said second conductive array parameter differing from said first conductive array parameter; and
    an interposer between said first and second substrates which spatially transforms said differing conductive array parameters of said first and second substrates, said interposer having first and second conductive array grids with differing first and second conductive array parameters, respectively, a plurality of conductors traversing a thickness of said interposer comprising at least a conductive material surrounded by a non-conductive material, and a matrix surrounding said plurality of conductors;
    wherein said non-conductive material of said conductors has a radial thickness changing as said conductors traverse through said interposer to spatially transform said differing conductive array parameters of said first and second substrates by connecting the first and second conductive array grids of the interposer to the first and second conductive array grids of the first and second substrates to provide an electronic package assembly with an electrical interconnection therebetween.

2. The apparatus of claim 1 wherein in said first and second conductive array grids have an equal number of arrays.

3. The apparatus of claim 1 wherein said non-conductive material surrounding said conductive material of the conductors comprises a dielectric material.

4. The apparatus of claim 1 wherein the interposer comprises a non-conductive interposer made from a non-conductive material.

5. The apparatus of claim 1 wherein the interposer comprises a conductive interposer made from conductive material.

6. The apparatus of claim 5 wherein said conductive material is selected from the group consisting of conductive polymer, inorganic composite, and metal.

7. The apparatus of claim 1 wherein said conductive material comprises a conductive wire.

8. The apparatus of claim 1 wherein said conductive material comprises a via filled with conductive material.

9. The apparatus of claim 1 wherein said plurality of conductors traverse a thickness of said interposer, said conductors forming a plurality of angles with a top portion and a bottom portion of said interposer, thereby providing said electrical interconnection.

10. The apparatus of claim 1 wherein said interposer is aligned between the two substrates in a first level attachment.

11. The apparatus of claim 1 wherein said interposer is aligned between the two substrates in a second level attachment.

12. The apparatus of claim 1 wherein the electronic package assembly further comprises said interposer of the electronic package assembly having top and bottom portions, said top portion having said first conductive array grid and said bottom portion having said second conductive array grid.

13. The apparatus of claim 1 wherein said conductive material of said conductors is selected from the group consisting of copper, tungsten, molybdenum, aluminum and gold.

14. The apparatus of claim 1 wherein said non-conductive material of said conductors is selected from the group consisting of organic polymer, polyimide, polyester, alumina, glass, and inorganic powder filled polymer.

15. The apparatus of claim 1 wherein said differing conductive array parameters include array parameters selected from the group consisting of differing array shape, array size, type of array, and combinations thereof.

16. The apparatus of claim 15 wherein said differing conductive array parameters include type of array, and wherein said type of array includes arrays selected from the group consisting of leads, pins, wires, pads, balls, fingers, and combinations thereof.

17. The apparatus of claim 15 wherein said differing conductive array parameters further include differing array pitch measurements in combination with said differing conductive array parameters selected from the group consisting of differing array shape, array size, type of array, and combinations thereof.

18. The apparatus of claim 1 wherein said first and second substrates comprise first and second electronic modules.

19. The apparatus of claim 18 wherein said interposer comprises a material having a coefficient of thermal expansion corresponding to the coefficient of thermal expansions of said first and second electronic modules.

20. A surface mount assembly comprising:
    a first substrate having a first conductive array grid with a first conductive array parameter;
    a second substrate having a second conductive array grid with a second conductive array parameter, said second conductive array parameter differing from said first conductive array parameter; and
    an interposer between and interconnecting said first and second substrates to spatially transform said differing conductive array parameters of said first and second substrates, said interposer comprising:
        an interposer having a top surface and a bottom surface,
        a first set of conductive arrays having a first conductive array parameter on said top surface which corresponds to said first conductive array parameter of said first substrate,
        a second set of conductive arrays having a differing second conductive array parameter on said bottom surface which corresponds to said second conductive array parameter of said second substrate,
        a plurality of conductors traversing a thickness of said interposer comprising at least a conductive material surrounded by a non-conductive material, and a matrix surrounding said plurality of conductors, whereby said non-conductive material of said conductors has a radial thickness changing as said conductors traverse through said interposer to spatially transform said differing conductive array parameters of said first and second substrates by connecting the first set of conductive arrays of the interposer to the corresponding first conductive array grid of the first substrate and connecting the second set of conductive arrays of the interposer to the second conductive array grid of the second substrate to provide an electronic package assembly having electrical interconnection therebetween.

21. The apparatus of claim 20 wherein said first and second substrates comprise first and second electronic modules.

22. The apparatus of claim 21 wherein said interposer comprises a material having a coefficient of thermal expansion corresponding to the coefficient of thermal expansions of said first and second electronic modules.

23. The apparatus of claim 20 wherein said plurality of conductors traverse through said interposer to provide the interconnection between the first and second substrates which have an equal number of conductive arrays on each of the corresponding conductive array grids but differing array parameters.

24. The apparatus of claim 20 wherein said plurality of conductors traverse a thickness of said interposer, said conductors forming a plurality of angles with a top portion and a bottom portion of said interposer, thereby providing said electrical interconnection.

25. The apparatus of claim 20 wherein said interposer is aligned between the two substrates in a first level attachment.

26. The apparatus of claim 20 wherein said interposer is aligned between the two substrates in a second level attachment.

27. The apparatus of claim 20 wherein said conductive material of said conductors is selected from the group consisting of copper, tungsten, molybdenum, aluminum and gold.

28. The apparatus of claim 20 wherein said non-conductive material of said conductors is selected from the group consisting of organic polymer, polyimide, polyester, alumina, glass, and inorganic powder filled polymer.

29. The apparatus of claim 20 wherein said differing conductive array parameters include array parameters selected from the group consisting of differing array shape, array size, type of array, and combinations thereof.

30. The apparatus of claim 29 wherein said differing conductive array parameters include type of array, and wherein said type of array includes arrays selected from the group consisting of leads, pins, wires, pads, balls, fingers, and combinations thereof.

31. The apparatus of claim 29 wherein said differing conductive array parameters further include differing array pitch measurements in combination with said differing conductive array parameters selected from the group consisting of differing array shape, array size, type of array, and combinations thereof.

* * * * *